United States Patent
Kang et al.

(10) Patent No.: US 10,431,606 B2
(45) Date of Patent: Oct. 1, 2019

(54) DISPLAY APPARATUS

(71) Applicant: Samsung Display Co., Ltd., Yongin-si, Gyeonggi-do (KR)

(72) Inventors: Jangmi Kang, Yongin-si (KR); Meehye Jung, Yongin-si (KR); Hyunjoon Kim, Yongin-si (KR); Cheolgon Lee, Yongin-si (KR); Sehyoung Cho, Yongin-si (KR); Injae Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/871,103

(22) Filed: Jan. 15, 2018

(65) Prior Publication Data

US 2018/0151600 A1 May 31, 2018

Related U.S. Application Data

(63) Continuation of application No. 15/272,140, filed on Sep. 21, 2016, now Pat. No. 9,899,429.

(30) Foreign Application Priority Data

Oct. 28, 2015 (KR) .................. 10-2015-0150265

(51) Int. Cl.
*H01L 27/12* (2006.01)
*H01L 23/00* (2006.01)
(Continued)

(52) U.S. Cl.
CPC .......... *H01L 27/1244* (2013.01); *H01L 24/05* (2013.01); *H01L 27/127* (2013.01); *H01L 27/3276* (2013.01); *H01L 27/3223* (2013.01); *H01L 27/3262* (2013.01); *H01L 29/78666* (2013.01); *H01L 29/78675* (2013.01); *H01L 51/0541* (2013.01); *H01L 2224/02251* (2013.01); *H01L 2224/02255* (2013.01);
(Continued)

(58) Field of Classification Search
None
See application file for complete search history.

(56) References Cited

U.S. PATENT DOCUMENTS

| 2,439,397 A | 4/1948 | Norquist |
| 5,271,147 A | 12/1993 | Ogata |

(Continued)

FOREIGN PATENT DOCUMENTS

| KR | 10-2003-0010873 A | 6/2003 |
| KR | 10-2013-0007053 A | 1/2013 |

(Continued)

*Primary Examiner* — Sitaramarao S Yechuri
(74) *Attorney, Agent, or Firm* — Lewis Roca Rothgerber Christie LLP (57) ABSTRACT

A display device includes a substrate including a display region, and a peripheral region that is outside of the display region, a plurality of dummy pads at the peripheral region, an insulating layer covering the plurality of dummy pads, wherein top surfaces of first portions of the insulating layer above the plurality of dummy pads are higher than top surfaces of second portions of the insulating layer between the plurality of dummy pads, and a plurality of pads over the second portions of the insulating layer at the peripheral region.

8 Claims, 4 Drawing Sheets

(51) Int. Cl.
*H01L 27/32* (2006.01)
*H01L 29/786* (2006.01)
*H01L 51/05* (2006.01)

(52) U.S. Cl.
CPC .............. *H01L 2224/06135* (2013.01); *H01L 2224/06155* (2013.01); *H01L 2227/323* (2013.01); *H01L 2251/5392* (2013.01); *H01L 2924/381* (2013.01)

(56) References Cited

U.S. PATENT DOCUMENTS

| | | | |
|---|---|---|---|
| 5,341,564 A * | 8/1994 | Akhavain | ............... H01L 23/13 174/557 |
| 6,190,940 B1 | 2/2001 | DeFelice et al. | |
| 6,204,081 B1 | 3/2001 | Kim et al. | |
| 6,362,435 B1 | 3/2002 | Downey et al. | |
| 7,067,350 B1 | 6/2006 | Liou | |
| 2006/0071243 A1* | 4/2006 | Hsu | ....................... G02F 1/1345 257/223 |
| 2007/0019122 A1* | 1/2007 | Lee | ....................... H01L 29/458 349/43 |
| 2007/0035239 A1 | 2/2007 | Kang et al. | |
| 2007/0090403 A1 | 4/2007 | Ahn et al. | |
| 2013/0001563 A1 | 1/2013 | Park et al. | |
| 2013/0126882 A1 | 5/2013 | You et al. | |
| 2014/0042394 A1 | 2/2014 | Lee | |
| 2015/0243724 A1* | 8/2015 | Cho | ................... H01L 29/7869 257/43 |

FOREIGN PATENT DOCUMENTS

| | | |
|---|---|---|
| KR | 10-2013-0109393 A | 8/2013 |
| KR | 10-2014-0020565 A | 2/2014 |

\* cited by examiner

DISPLAY APPARATUS

CROSS-REFERENCE TO RELATED APPLICATION

This application is a continuation of U.S. patent application Ser. No. 15/272,140, filed Sep. 21, 2016, which claims priority to and the benefit of Korean Patent Application No. 10-2015-0150265, filed Oct. 28, 2015, the entire content of both of which is incorporated herein by reference.

BACKGROUND

1. Field

One or more embodiments relate to a display apparatus in which a short-circuit ratio is low in pads/pad units.

2. Description of the Related Art

A display device is a device that receives information or data regarding an image, and displays the image. The display device includes pads, which are electrically connected to display elements, at one or more edges thereof to receive information or data regarding an image, etc. The pads are electrically connected to pads of a printed circuit board (PCB), bumps of an electronic chip, or the like. In this case, the pads of the PCB or the bumps of the electronic chip should be electrically connected to preset pads corresponding thereto.

SUMMARY

However, in a display device according to the related art, pads of a printed circuit board (PCB), or bumps of an electronic chip, are electrically connected to not only pads corresponding thereto, but are also connected to pads adjacent thereto, and thus, a short circuit may occur. Also, the display device according to the related art has a problem, in that a short circuit may occur because adjacent pads are electrically connected to each other.

To address the problems above, one or more embodiments include a display device in which a short-circuit ratio is low in pads. However, the one or more embodiments are merely examples, and thus the inventive concept is not limited thereto.

Additional aspects will be set forth in part in the description that follows and, in part, will be apparent from the description, or may be learned by practice of the presented embodiments.

According to one or more embodiments, a display device includes a substrate including a display region, and a peripheral region that is outside of the display region, a plurality of dummy pads at the peripheral region, an insulating layer covering the plurality of dummy pads, wherein top surfaces of first portions of the insulating layer above the plurality of dummy pads are higher than top surfaces of second portions of the insulating layer between the plurality of dummy pads, and a plurality of pads over the second portions of the insulating layer at the peripheral region.

A first distance from a top surface of the substrate to the top surfaces of the first portions of the insulating layer may be greater than a second distance from the top surface of the substrate to top surfaces of the plurality of pads.

The display device may further include conductive balls having a diameter that is greater than a difference between the first distance and the second distance, and being in electrical contact with the top surfaces of the plurality of pads, and an electronic chip or a printed circuit board in electrical contact with the conductive balls to be electrically connected to at least one of the pads.

The display device may further include a thin-film transistor at the display region, the thin-film transistor including a semiconductor layer, a gate electrode above the semiconductor layer, and a source electrode and a drain electrode above the gate electrode, wherein the insulating layer extends to the display region, and is between the gate electrode and the source and drain electrodes.

The plurality of pads may include a same material as the source and drain electrodes, and the plurality of dummy pads may include a same material as the gate electrode.

The display device may further include a plurality of additional dummy pads below the plurality of dummy pads and including a same material as the semiconductor layer.

The plurality of dummy pads may include a plurality of first dummy pads, and a plurality of second dummy pads above the plurality of first dummy pads.

The display device may further include an additional insulating layer between the plurality of first dummy pads and the plurality of second dummy pads.

The display device may further include a first thin-film transistor at the display region, the first thin-film transistor including a first semiconductor layer, a first gate electrode above the first semiconductor layer, and a first source electrode and a first drain electrode above the first gate electrode, and a second thin-film transistor in the display region of the substrate, the second thin-film transistor including a second semiconductor layer, a second gate electrode above the second semiconductor layer and over the additional insulating layer, and a second source electrode and a second drain electrode above the second gate electrode, the additional insulating layer may extend to the display region and covers the first gate electrode, and the insulating layer may extend to the display region, and is between the second gate electrode and the first and second source and drain electrodes.

The plurality of pads may include a same material as the first and second source and drain electrodes, the plurality of first dummy pads may include a same material as the first gate electrode, and the plurality of second dummy pads may include a same material as the second gate electrode.

The display device may further include a plurality of additional dummy pads below the plurality of dummy pads and including a same material as the first and second semiconductor layers.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
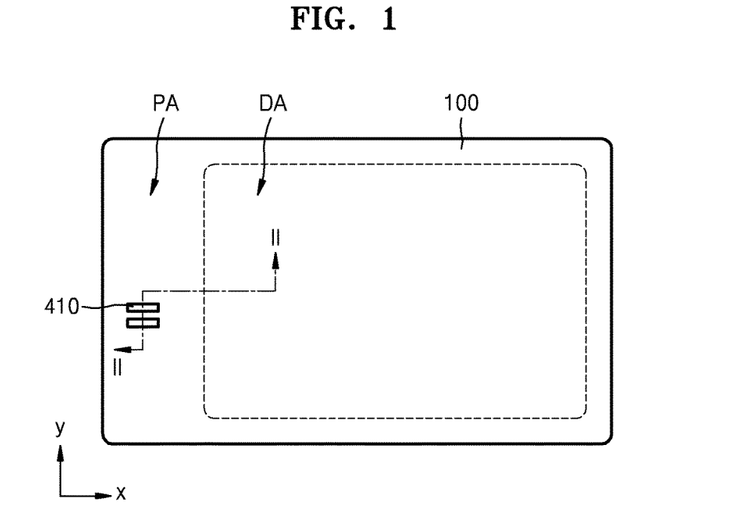
FIG. 1 is a schematic plan view of a display device according to an embodiment.
Figure 2:
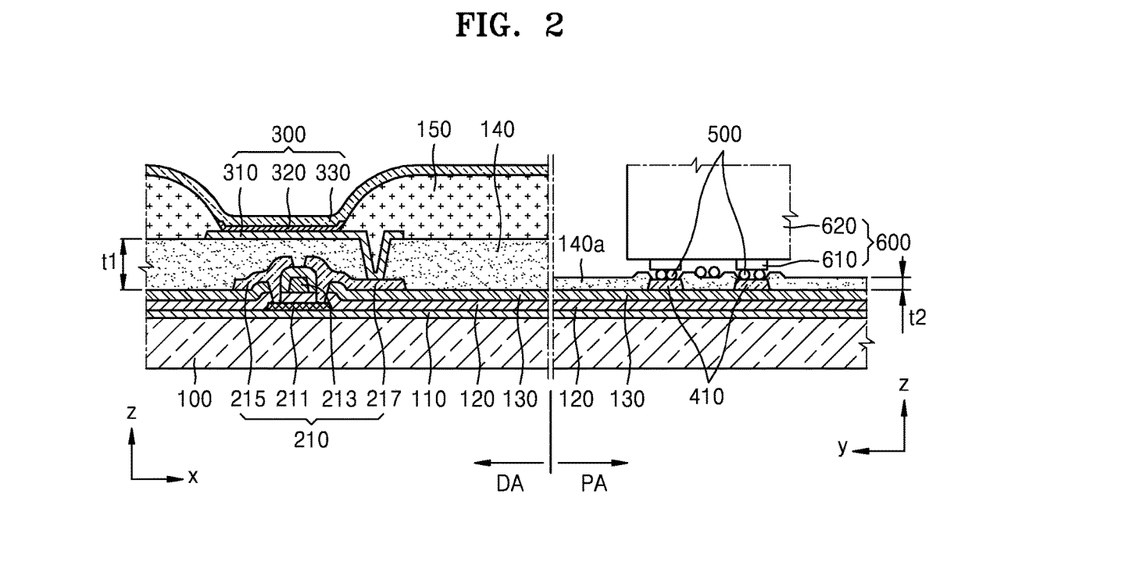
FIG. 2 is a schematic cross-sectional view taken along the line II-II of FIG. 1.

FIG. 1 is a schematic plan view of a display device according to an embodiment. FIG. 2 is a schematic cross-sectional view taken along the line II-II of FIG. 1, and illustrates the display device as an organic light-emitting display device, which includes an organic light-emitting device/organic light-emitting diode 200.

The display device according to the present embodiment includes a substrate 100 including a display region DA in which organic light-emitting devices 300, which are display devices, are located, and includes a peripheral region PA, which is a non-display region that is outside the display region DA. The substrate 100 may include various materials, such as a glass material, a metal material, a plastic material, etc.

A first thin-film transistor 210 is in the display region DA of the substrate 100. In addition, the organic light-emitting device 300 electrically connected to the first thin-film transistor 210 may be in the display region DA. The electrical connection of the organic light-emitting device 300 to the first thin-film transistor 210 may be understood as a pixel electrode 310 being electrically connected to the first thin-film transistor 210. Alternatively, a first thin-film transistor may be also located in the peripheral region PA of the substrate 100. The first thin-film transistor located in the peripheral region PA may be, for example, a part of a circuit for controlling an electrical signal to be supplied into the display region DA.

The first thin-film transistor 210 includes a first semiconductor layer 211, which includes amorphous silicon, polycrystalline silicon, or an organic semiconductor material, a first gate electrode 213, a first source electrode 215, and a first drain electrode 217. A buffer layer 110 formed of a silicon oxide, a silicon nitride, or the like may be located over the substrate 100 to planarize a surface of the substrate 100, or to prevent impurities, etc. from penetrating the first semiconductor layer 211. The first semiconductor layer 211 may be located over the buffer layer 110.

The first gate electrode 213 is over the first semiconductor layer 211. The first source electrode 215 and the first drain electrode 217 are electrically connected to each other according to a signal supplied to the first gate electrode 213. The first gate electrode 213 may be provided in a single layer structure, or in a multi-layer structure formed of, for example, at least one selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), taking into account an adhesive property between the first gate electrode 213 and a layer adjacent thereto, a surface smoothness of a surface of a layer to be stacked thereon, processability, etc. In this case, to secure an insulating property between the first semiconductor layer 211 and the first gate electrode 213, a gate insulating layer 120 formed of silicon oxide and/or a silicon nitride may be between the first semiconductor layer 211 and the first gate electrode 213.

An interlayer insulating layer 130 may be located over the first gate electrode 213. The interlayer insulating layer 130 may be provided in a single layer structure, or in a multi-layer structure formed of a silicon oxide, a silicon nitride, or the like.

The first source electrode 215 and the first drain electrode 217 are over the interlayer insulating layer 130. The first source electrode 215 and the first drain electrode 217 are respectively electrically connected to the first semiconductor layer 211 via respective contact holes in the interlayer insulating layer 130 and respective contact holes in the gate insulating layer 120. The first source electrode 215 and the first drain electrode 217 may be provided in a single layer structure or in a multi-layer structure formed of, for example, at least one selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), taking account into a conductive property, etc.

A protective film may be provided to cover the first thin-film transistor 210 to protect the first thin-film transistor 210 having the above structure. The protective film may include, for example, an inorganic material such as a silicon oxide, a silicon nitride, a silicon oxynitride, etc. The protective film may be a single layer structure or a multi-layer structure.

A planarization layer 140 may be located over the protective film. For example, as illustrated in FIG. 2, when the organic light-emitting device 300 is above the first thin-film transistor 210, the planarization layer 140 may planarize an upper portion of the protective film covering the first thin-film transistor 210. The planarization layer 140 may include, for example, an acryl-based organic material, benzocyclobutene (BCB), and/or the like. Although FIG. 2 illustrates the planarization layer 140 as a single layer, embodiments are not limited thereto, and the planarization layer 140 may be a multi-layer structure.

The display device according to the present embodiment may include both of the protective film and the planarization layer 140, or may include only one of them.

In the display region DA of the substrate 100, the organic light-emitting device 300 is over the planarization layer 140. The organic light-emitting device 300 includes the pixel electrode 310, an opposite electrode 330, and an intermediate layer 320 interposed between the pixel electrode 310 and the opposite electrode 330 and including an emission layer.

An opening is provided in the planarization layer 140 to expose at least one of the first source electrode 215 and the first drain electrode 217 of the first thin-film transistor 210. The pixel electrode 310 is provided over the planarization layer 140. The pixel electrode 310 is in electrical contact with the first source electrode 215 or the first drain electrode 217 via the opening to be electrically connected to the first thin-film transistor 210. The pixel electrode 310 may be a transparent (or semi-transparent) electrode, or may be a reflective electrode. When the pixel electrode 310 is the transparent (or semi-transparent) electrode, the pixel electrode 310 may include, for example, ITO, IZO, ZnO, $In_2O_3$, IGO, and/or AZO. When the pixel electrode 310 is the reflective electrode, the pixel electrode 310 may include a reflective film formed of Ag, Mg, Al, Pt, Pd, Au, Ni, Nd, Ir, Cr, or a compound thereof, and may include a layer formed of ITO, IZO, ZnO, $In_2O_3$, IGO, or AZO. However, embodiments are not limited thereto, and the pixel electrode 310 may include various materials, and may have any of various structures, e.g., a single layer structure or a multi-layer structure.

A pixel defining film 150 may be located over the planarization layer 140. The pixel defining film 150 includes openings corresponding to respective sub-pixels (i.e., at least one opening for exposing a central region of the pixel electrode 310) to define a pixel. Also, as illustrated in FIG. 2, the pixel defining film 150 increases a distance between an edge of the pixel electrode 310 and the opposite electrode 330 above the pixel electrode 310 to prevent an arc, or the like, to occur at the edge of the pixel electrode 310. The pixel defining film 150 may include, for example, an organic material, such as polyimide.

The intermediate layer 320 of the organic light-emitting device 300 may include a low molecular weight material, or a high molecular weight material. When the intermediate layer 320 includes the low molecular weight material, the intermediate layer 320 may have a stacked structure including at least one among a hole injection layer (HIL), a hole transport layer (HTL), an emission layer (EML), an electron transport layer (ETL), an electron injection layer (EIL), etc., and may include various organic materials, such as CuPc (copper phthalocyanine), N,N'-Di(naphthalene-1-yl)-N,N'-diphenyl-benzidine (NPB), tris-8-hydroxyquinoline aluminum (Alq3), etc. These layers may be formed by vacuum deposition.

In general, when the intermediate layer 320 includes the high molecular weight material, the intermediate layer 320 may have a structure including a hole injection layer (HIL) and an emission layer (EML). In this case, the HIL may include PEDOT, and the emission layer may include a polymeric material, such as poly-phenylenevinylene (PPV)-based polymeric material, a polyfluorene-based polymeric material, etc. The intermediate layer 320 may be formed by screen printing, inject printing, laser induced thermal imaging (LITI), etc. However, the intermediate layer 320 is not limited thereto, and may have any of other various structures.

The opposite electrode 330 is over the top of the display region DA, and may be arranged to cover the display region DA, as illustrated in FIG. 2. That is, the opposite electrode 330 may be integrally formed across a plurality of organic light-emitting devices 200 to correspond to a plurality of pixel electrodes 310 (e.g., may be a common electrode). The opposite electrode 330 may be a transparent (or semi-transparent) electrode, or may be a reflective electrode. When the opposite electrode 330 is the transparent (or semi-transparent) electrode, the opposite electrode 330 may include a layer formed of a metal having a low work function (i.e., Li, Ca, LiF/Ca, LiF/Al, Al, Ag, Mg, or a compound thereof), and formed of a transparent (semi-transparent) conductive layer formed of ITO, IZO, ZnO, $In_2O_3$, or the like. When the opposite electrode 330 is the reflective electrode, the opposite electrode 330 may include a layer formed of Li, Ca, LiF/Ca, LiF/Al, Al, Ag, Mg, or a compound thereof. However, the opposite electrode 330 is not limited to the above structures and materials, and may be embodied in many different forms.

A plurality of pads 410 are located in the peripheral region PA of the substrate 100. The plurality of pads 410 may be located, for example, on the same layer as the first source electrode 215 and the first drain electrode 217 (i.e., over the interlayer insulating layer 130), as illustrated in FIG. 2. In this case, the plurality of pads 410 may include the same material as the first source electrode 215 and the first drain electrode 217. During the manufacture of the display device, the plurality of pads 410 may be formed during a same process as the first source electrode 215 and the first drain electrode 217.

A portion of an edge of each of the plurality of pads 410 over the interlayer insulating layer 130 is covered with a pad separation layer 140a. FIG. 2 illustrates that each of the plurality of pads 410 extends in an x-axis direction, and edges of each of the plurality of pads 410, which are in a +y-axis direction and a −y-axis direction, are covered with the pad separation layer 140a. Because the edges of the plurality of pads 410 are covered with an end of the pad separation layer 140a, the end of the pad separation layer 140a is over the plurality of pads 410, and the height of a top surface of the end of the pad separation layer 140a is higher than a height(s) of top surfaces of the plurality of pads 410. The pad separation layer 140a has a thickness t2, which is different from a thickness t1 of the planarization layer 140, but may be formed of the same material as the planarization layer 140 during a process when the planarization layer 140 is formed.

An electronic chip 600 may be located over the plurality of pads 410. Bumps 610 at a bottom of a body 620 of the electronic chip 600 are adhered to the pads 410 via an anisotropic conductive film (ACF) to be electrically connected to the pads 410. That is, conductive balls 500 included in the ACF are in electrical contact with both of the pads 410 and the bumps 610 to electrically connect the pads 410 and the bumps 610. The conductive balls 500 have a diameter that is greater than the distance between, or height difference between, the top surface of the end of the pad separation layer 140a and the top surfaces of the plurality of pads 410. Thus the conductive balls 500 protrude upward more than the top surface of the end of the pad separation layer 140a to be in electrical contact with the bumps 610, as illustrated in FIG. 2. In the display device according to the present embodiment, the bumps 610 of the electronic chip 600 are electrically connected to only pads (e.g., preset pads) 410 corresponding thereto.

Because the pad separation layer 140a includes/defines the openings for respectively exposing the pads 410, as described above, the conductive balls 500 are located inside or outside the openings of the pad separation layer 140a when the ACF is placed over and around the pads 410, and when the electronic chip 600 is pressurized/pressed downward (i.e., pressed in a −z-axis direction) to adhere the electronic chip 600 to the pads 410. In this case, the conductive balls 500 inside of the openings of the pad separation layer 140a, and the conductive balls 500 outside of the openings of the pad separation layer 140a, are physically separated due to ends of the pad separation layer 140a, which protrude upward. Thus, the bumps 610 of the electronic chip 600 are electrically connected to only the pads 410 corresponding thereto, and a short circuit does not occur between the pads 410 due to the conductive balls 500.

When the pad separation layer 140a is omitted, unlike what is shown in FIG. 2, the conductive balls 500 may be arranged in a row (e.g., aligned in a y-axis direction) to be in electrical contact with side surfaces of adjacent conductive balls 500. In this case, the conductive balls 500 electrically connect the pads 410 with each other, thereby causing a short circuit to occur.

Figure 3:
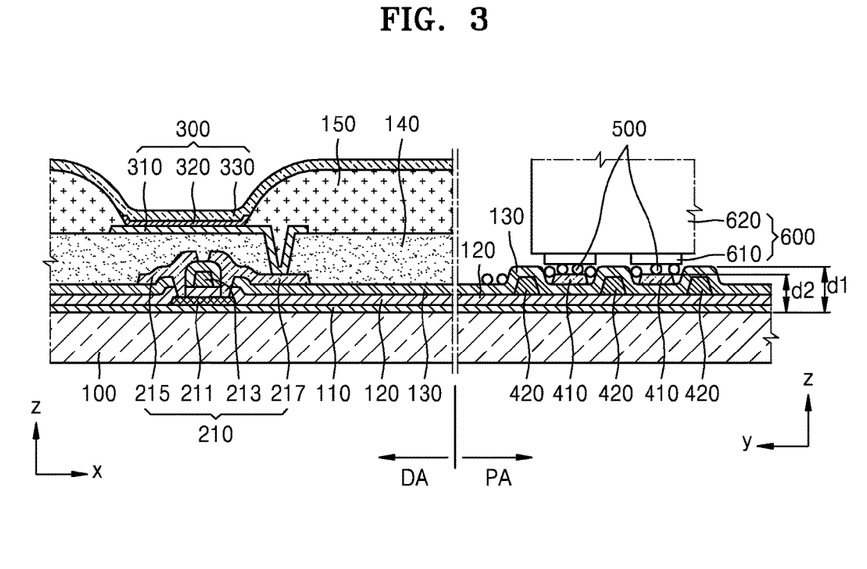
FIG. 3 is a schematic cross-sectional view of a part of a display device according to another embodiment.

FIG. 3 is a schematic cross-sectional view of a part of a display device according to another embodiment. The display device according to the present embodiment is different from the display device described above with reference to FIG. 2, in that a plurality of dummy pads 420 are provided, and in that the pad separation layer 140a shown in FIG. 2 is omitted.

In detail, the display device according to the present embodiment includes the plurality of dummy pads 420 located in a peripheral region PA of a substrate 100. As illustrated in FIG. 3, the plurality of dummy pads 420 may include the same material as a first gate electrode 213 of a first thin-film transistor 210, and may be located over a gate insulating layer 120 in a manner similar to the first gate electrode 213 of the first thin-film transistor 210. That is, the plurality of dummy pads 420 may be formed during a same process as the first gate electrode 213 of the first thin-film transistor 210 by using the same material during the manufacture of the display device.

Not only the first gate electrode 213, but also the plurality of dummy pads 420, are covered with an interlayer insulating layer 130. That is, the interlayer insulating layer 130 extends to not only the peripheral region PA, but also extends to a display region DA to be interposed between the first gate electrode 213 and the first source and drain electrodes 215 and 217. A top surface of the interlayer insulating layer 130 has a concavo-convex structure corresponding to a shape of a structure below the interlayer insulating layer 130. Thus, top surfaces of first portions of the interlayer insulating layer 130, which correspond to locations of the plurality of dummy pads 420, are higher than top surfaces of second portions of the interlayer insulating layer 130, which correspond to spaces between the plurality of dummy pads 420. Here, the first portions of the interlayer insulating layer 130 may correspond to the top surfaces of the plurality of dummy pads 420, as opposed to side surfaces of the plurality of dummy pads 420, and may be farthest from a top surface of the substrate 100 among all portions of the interlayer insulating layer 130. A plurality of pads 410 are provided over the interlayer insulating layer 130, and more particularly, are provided over the second portions of the interlayer insulating layer 130 corresponding to the spaces between the plurality of dummy pads 420.

An electronic chip 600 may be located over the plurality of pads 410. Bumps/protrusions 610 at a bottom of a body 620 of the electronic chip 600 are adhered to the plurality of pads 410 via an ACF to be electrically connected to the plurality of pads 410. That is, conductive balls 500 included in the ACF are in electrical contact with both of the plurality of pads 410 and the bumps 610 to electrically connect the plurality of pads 410 and the bumps 610 to one another. The conductive balls 500 each have a diameter that is greater than the distance between, or height difference of, the top surfaces of the first portions of the interlayer insulating layer 130, which are above/correspond to the plurality of dummy pads 420, and top surfaces of the plurality of pads 410.

Specifically, when the distance from the top surface of the substrate 100 to the top surfaces of the first portions of the interlayer insulating layer 130 is defined as a first distance, and when the distance from the top surface of the substrate 100 to the top surfaces of the plurality of pads 410 is defined as a second distance, the conductive balls 500 have a diameter that is greater than the difference between the first distance and the second distance. Thus the conductive balls 500 protrude upwardly more than, or have a surface that is higher than, the top surfaces of the first portions of the interlayer insulating layer 130 to thereby be in electrical contact with the bumps 610, as illustrated in FIG. 3. In the display device according to the present embodiment, the bumps 610 of the electronic chip 600 are electrically connected to only pads 410 corresponding thereto.

Because the top surfaces of the first portions of the interlayer insulating layer 130, which correspond to locations of the plurality of dummy pads 420, are higher than the top surfaces of the second portions of the interlayer insulating layer 130, which are between adjacent dummy pads 420, as described above, the interlayer insulating layer 130 having the above structure may function to be substantially the same as the pad separation layer 140a shown in FIG. 2. Thus, the conductive balls 500 are located between, or outside of, the first portions of the interlayer insulating layer 130, rather than over/above the first portions of the interlayer insulating layer 130, when the ACF is placed over and around the plurality of pads 410, and when the electronic chip 600 is pressurized/pressed downward (e.g., pressed in a −z-axis direction), the electronic chip 600 is adhered onto the plurality of pads 410. As described above, the locations of the conductive balls 500 are limited by the first portions of the interlayer insulating layer 130. Thus, the bumps 610 of the electronic chip 600 are electrically connected to only pads 410 corresponding thereto, and a short circuit does not occur between the plurality of pads 410 due to the conductive balls 500.

In the display device described above with reference to FIG. 2, a process of forming the planarization layer 140 and the pad separation layer 140a is relatively complicated. That is, as illustrated in FIG. 2, to form the planarization layer 140 having the thickness t1 and the pad separation layer 140a having the thickness t2, while using the same material, a halftone mask process, which is relatively expensive and has strict process conditions, should be performed. If the planarization layer 140 having the thickness t1 and the pad separation layer 140a having the thickness t2 are formed according to separate processes, the processes are more complicated, and thus, manufacturing costs increase In contrast, in the display device according to the present embodiment, the plurality of dummy pads 420 may be formed during a same process as the first gate electrode 213 of the first thin-film transistor 210. The interlayer insulating layer 130 may be formed to have the same thickness at the display region DA and at the peripheral region PA. The plurality of pads 410 may be formed during a same process as the first source electrode 215 and the first drain electrode 217 of the first thin-film transistor 210. The planarization layer 140 need not be formed over the plurality of pads 410, or may be formed over the plurality of pads 410 and then removed from the pads 410 and/or from the vicinity thereof. In the case of the latter, a via hole is provided in the planarization layer 140 to connect the first source electrode 215 or the first drain electrode 217 to a pixel electrode 310. When the via hole is formed, the planarization layer 140 may be removed from the pads 410, and/or from the vicinity thereof, during a same process.

As described above, in the case of the display device according to the present embodiment, the plurality of pads 410 and elements near the plurality of pads 410 may be formed during a same process while forming the display region DA, thereby simplifying a process of manufacturing the display device. Also, the bumps 610 of the electronic chip 600 may be electrically connected to only intended pads 410 corresponding thereto, and a short circuit may be prevented from occurring between the plurality of pads 410, as described above, without complicating the process of manufacturing the display device.

Although it is described above that the plurality of dummy pads 420 is formed during a same process as the first gate electrode 213 by using the same material, embodiments are not limited thereto and the plurality of dummy pads 420 may be formed of a different material. Also, the plurality of dummy pads 420 need not be located over the gate insulating layer 120, and may instead be located over another layer. Also, a layer over which the plurality of pads 410 are located is not limited to the interlayer insulating layer 130, and may be any layer covering the plurality of dummy pads 420. This also applies to the following embodiments and modified examples thereof.

As illustrated in FIG. 3, a distance d1 from the top surface of the substrate 100 to the top surfaces of the first portions of the interlayer insulating layer 130 is greater than a distance d2 from the top surface of the substrate 100 to the top surface of the plurality of pads 410. Thus, the bumps 610 of the electronic chip 600 may be electrically connected to only respective pads 410 corresponding thereto, and a short circuit may be effectively prevented from occurring between the plurality of pads 410. To increase the above aspects, a structure as illustrated in FIG. 4, which is a cross-sectional view of a portion of a display device according to another embodiment, may be employed.

Figure 4:
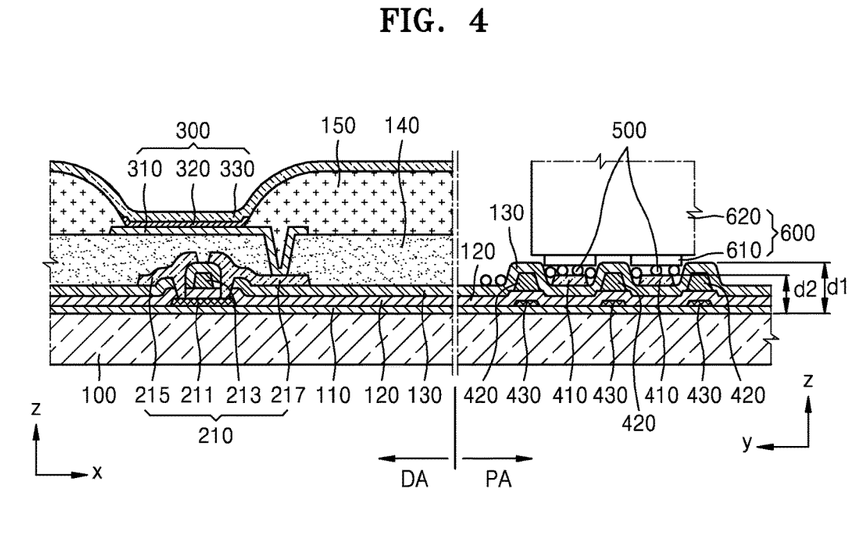
FIG. 4 is a schematic cross-sectional view of a part of a display device according to another embodiment.

The display device according to the present embodiment shown in FIG. 4 is different from the display device described above with reference to FIG. 3, in that additional dummy pads 430 are further provided. The additional dummy pads 430 may include the same material as a first semiconductor layer 211 of a first thin-film transistor 210, and may be located below a plurality of dummy pads 420. That is, the additional dummy pads 430 may be formed during a same process as the first semiconductor layer 211 of the first thin-film transistor 210 by using the same material.

In the display device according to the present embodiment described above, the difference between the distance d1, which is from the top surface of the substrate 100 to the top surfaces of the first portions of the interlayer insulating layer 130, and the distance d2, which is from the top surface of the substrate 100 to the top surfaces of the plurality of pads 410, is greater than in the previous embodiment described above with reference to FIG. 3, due to the additional dummy pads 430. Thus, bumps 610 of an electronic chip 600 may be more securely electrically connected to only pads 410 corresponding thereto and a short circuit may be more effectively prevented from occurring between the plurality of pads 410.

Figure 5:
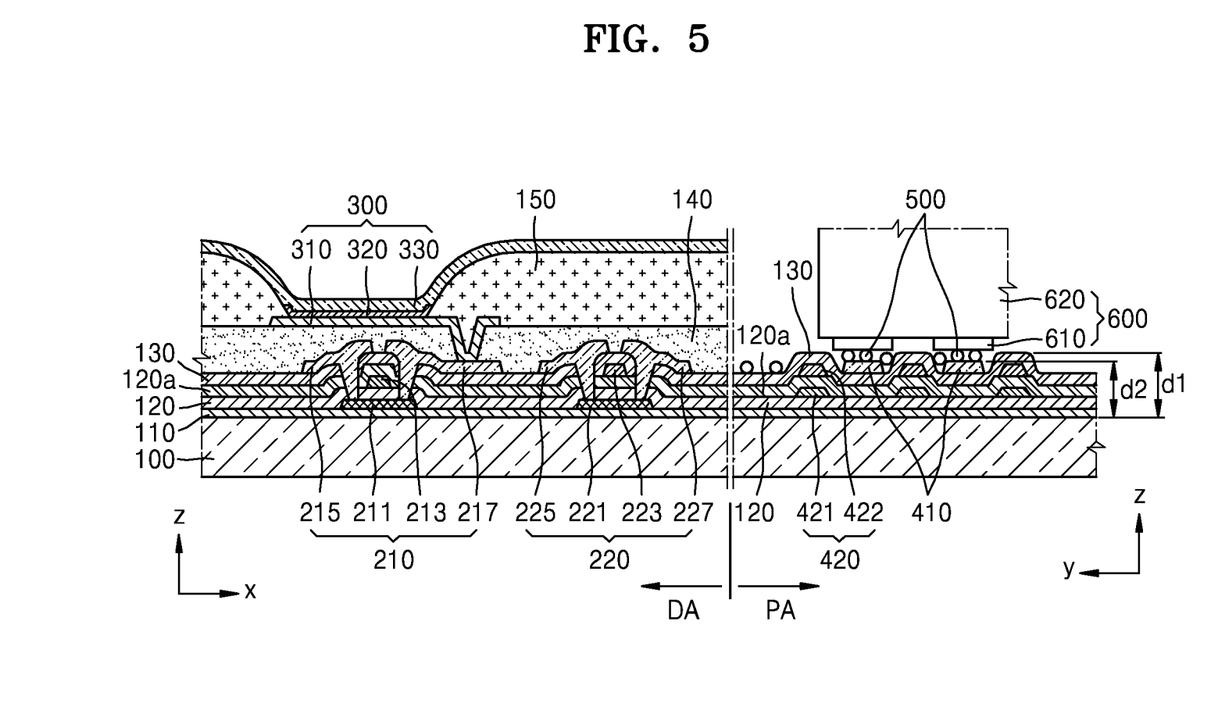
FIG. 5 is a schematic cross-sectional view of a part of a display device according to another embodiment.

FIG. 5 is a schematic cross-sectional view of a part of a display device according to another embodiment. In the display device according to the present embodiment, a first thin-film transistor 210 and a second thin-film transistor 220 are provided in a display region DA, and dummy pads 420 include first dummy pads 421 and second dummy pads 422, unlike in the previous embodiment described above with reference to FIG. 3. The display device according to the present embodiment is the same as the previous embodiment of FIG. 3, in that a first gate electrode 213 of the first thin-film transistor 210 is over a gate insulating layer 120, and in that a first source electrode 215 and a first drain electrode 217 of the first thin-film transistor 210 are over an interlayer insulating layer 130. However, the present embodiment is different from the previous embodiment of FIG. 3, in that an additional insulating layer 120a is between the gate insulating layer 120 and the interlayer insulating layer 130. In the second thin-film transistor 220, a second semiconductor layer 221 is on the same layer (i.e., on a buffer layer 110) as a first semiconductor layer 211, and a second source electrode 225 and a second drain electrode 227 are on the same layer (i.e., on the interlayer insulating layer 130) as the first source electrode 215 and the first drain electrode 217. However, a second gate electrode 223 is over the additional insulating layer 120a rather than the gate insulating layer 120. In this case, the additional insulating layer 120a covers the first gate electrode 213 and the first dummy pads 421, and the second dummy pads 422 are over the additional insulating layer 120a, so that the second dummy pads 422 may be above the first dummy pads 421.

In the display device according to the present embodiment described above, the first dummy pads 421 include the same material as the first gate electrode 213, and the second dummy pads 422 include the same material as the second gate electrode 223. That is, during the manufacture of the display device, the first dummy pads 421 may be formed during a same process with the first gate electrode 213 by using the same material, and the second dummy pads 422 may be formed during a same process with the second gate electrode 223 by using the same material.

In the display device according to the present embodiment described above, because the dummy pads 420 include the first dummy pads 421 and the second dummy pads 422, a distance d1 from a top surface of a substrate 100 to top surfaces of first portions of the interlayer insulating layer 130 corresponding to the dummy pads 420 may be sufficiently greater than a distance d2, which is from the top surface of the substrate 100 to the top surfaces of the plurality of pads 410.

In the display device according to the previous embodiment illustrated in FIG. 3, the top surfaces of the first portions of the interlayer insulating layer 130 are illustrated as protruding more than the top surfaces of the pads 410 due to sufficient thicknesses of the first gate electrode 213 and the dummy pads 420. However, when the first gate electrode 213 and the dummy pads 420 are not sufficiently thick, the top surfaces of the first portions of the interlayer insulating layer 130 might not protrude far more than the top surfaces of the pads 410.

However, in the display device according to the present embodiment, even if the first gate electrode 213, the second gate electrode 223, the first dummy pads 421, and the second dummy pads 422 are not sufficiently thick, when compared to the first gate electrode 213 illustrated in FIG. 3, the first dummy pads 421 and the second dummy pads 422 are located to vertically overlap each other, so that the top surfaces of the first portions of the interlayer insulating layer 130 may be protrude sufficiently when compared to the top surfaces of the pad 410. Thus, bumps 610 of an electronic chip 600 may be more securely electrically connected to only intended pads 410 corresponding thereto, and a short circuit may be more effectively prevented from occurring between the plurality of pads 410. To increase this aspect, a structure illustrated in FIG. 6, which is a schematic cross-sectional view of a portion of a display device according to another embodiment, may be employed.

Figure 6:
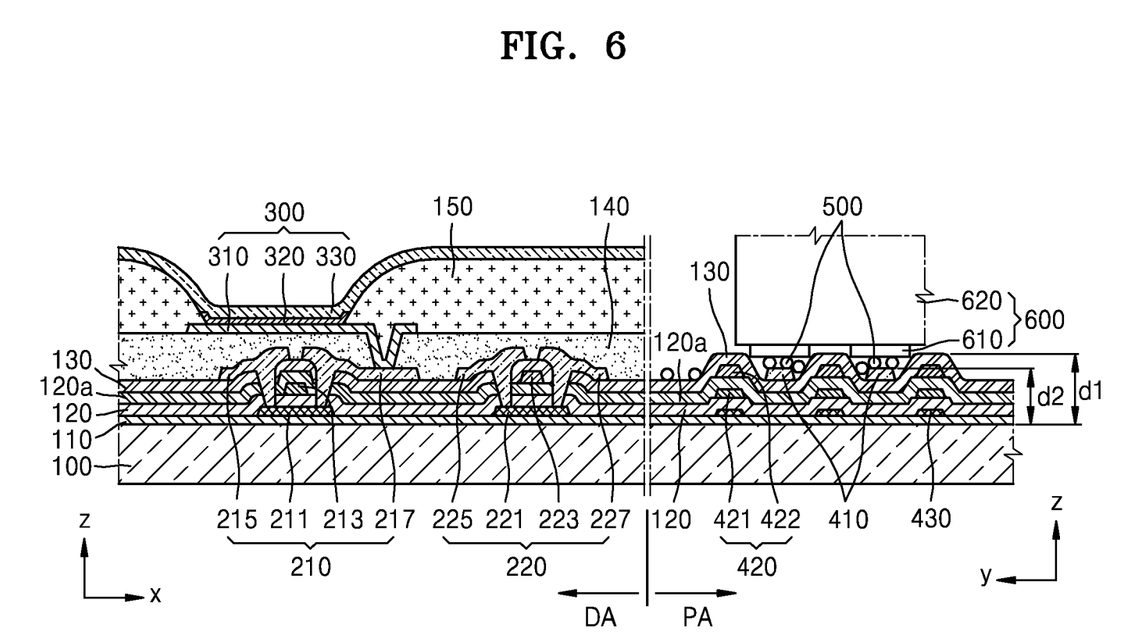
FIG. 6 is a schematic cross-sectional view of a part of a display device according to another embodiment.

The display device according to the present embodiment is different from the display device described above with reference to FIG. 5, in that additional dummy pads 430 are further provided. The additional dummy pads 430 may include the same material as a first semiconductor layer 211 of a first thin-film transistor 210, and may be located below dummy pads 420. That is, the additional dummy pads 430 may be formed during a same process as the first semiconductor layer 211 of the first thin-film transistor 210 by using the same material.

In the display device according to the present embodiment, the difference between a distance d1 from a top surface of a substrate 100 to top surfaces of first portions of an interlayer insulating layer 130, and a distance d2 from the top surface of the substrate 100 to top surfaces of a plurality of pads 410, is greater than in the previous embodiment described above with reference to FIG. 5, due to the additional dummy pads 430. Thus, bumps 610 of an electronic chip 600 may be more securely electrically connected to only intended pads 410 corresponding thereto, and a short circuit may be effectively prevented from occurring between the plurality of pads 410.

Although cases in which the organic light-emitting device 300 is a display device in the display region DA have been described above, embodiments are not limited thereto. For example, embodiments are also applicable to cases in which a liquid crystal display device, or another device, is employed as a display device. Also, although the cases in which the bumps 610 of the electronic chip 600 are electrically connected to the plurality of pads 410 have been described above, embodiments are not limited thereto, and may be embodied in many different forms, e.g., pads of a printed circuit board (PCB) may be electrically connected to the plurality of pads 410.

As described above, according to an embodiment, a display device in which a short-circuit ratio is low in pads may be realized. However, the scope of the inventive concept is not limited to the above effect.

It should be understood that embodiments described herein should be considered in a descriptive sense only, and not for purposes of limitation. Descriptions of aspects within each embodiment should typically be considered as available for other similar aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
   a substrate comprising a display region, and a peripheral region that is outside of the display region;
   a first dummy pad and a second dummy pad at the peripheral region, the first dummy pad vertically overlapping the second dummy pad;
   an insulating layer completely covering the first and second dummy pads such that each of the first and second dummy pads does not contact a conductive layer, wherein a top surface of a first portion of the insulating layer above a center of the first and second dummy pads is higher than a top surface of a second portion of the insulating layer adjacent the first and second dummy pads; and
   a pad over the second portion of the insulating layer at the peripheral region, the pad being electrically connected to an electronic chip or a printed circuit board.

2. The display device of claim 1, wherein a first distance from a top surface of the substrate to the top surface of the first portion of the insulating layer is greater than a second distance from the top surface of the substrate to the top surface of the pad.

3. The display device of claim 2, further comprising conductive balls having a diameter that is greater than a difference between the first distance and the second distance, and being in electrical contact with the top surface of the pad,
   wherein the electronic chip or the printed circuit board is in electrical contact with the conductive balls to be electrically connected to the pad.

4. The display device of claim 1, further comprising a thin-film transistor at the display region, the thin-film transistor comprising:
   a semiconductor layer;
   a gate electrode above the semiconductor layer; and
   a source electrode and a drain electrode above the gate electrode,
   wherein the insulating layer extends to the display region, and is between the gate electrode and the source and drain electrodes.

5. The display device of claim 4, wherein the pad comprises a same material as the source and drain electrodes, and
   wherein the first and second dummy pads comprise a same material as the gate electrode.

6. The display device of claim 4, further comprising another first dummy pad on a same layer as the first dummy pad, another second dummy pad on a same layer as the second dummy pad, a first additional dummy pad below the first dummy pad and the second dummy pad, and a second additional dummy pad below the other first dummy pad and the other second dummy pad, the first and second additional dummy pads comprising a same material as the semiconductor layer.

7. The display device of claim 1, wherein the pad is electrically connected to the electronic chip.

8. The display device of claim 1, wherein the pad is electrically connected to the electronic chip or the printed circuit board via an anisotropic conductive film.

* * * * *